US005659161A

United States Patent [19]
Takanohashi et al.

[11] Patent Number: 5,659,161
[45] Date of Patent: Aug. 19, 1997

[54] RUBBER CONTACT SWITCH

[75] Inventors: Daisuke Takanohashi; Keizo Nishitani; Masataka Nishijima; Tsuyoshi Oshima, all of Susono, Japan

[73] Assignee: Yazaki Corporation, Tokyo, Japan

[21] Appl. No.: 650,999

[22] Filed: May 21, 1996

[30] Foreign Application Priority Data

May 23, 1995 [JP] Japan .................................. 7-123736

[51] Int. Cl.⁶ .................................. H01H 9/26; H01H 1/10
[52] U.S. Cl. .................................. 200/5 A; 200/517
[58] Field of Search .................................. 200/5 A, 517; 219/92

[56] References Cited

U.S. PATENT DOCUMENTS 4,291,201  9/1981  Johnson et al. .................... 200/5 A
5,396,030  3/1995  Matsumiya et al. ................ 200/5 A
5,403,984  4/1995  Ogawa ............................... 200/517
5,584,380  12/1996 Naitou ............................... 200/315

FOREIGN PATENT DOCUMENTS 6-3752   1/1994  Japan .

Primary Examiner—Stuart N. Hecker
Attorney, Agent, or Firm—Oblon, Spivak, McClelland, Maier & Neustadt, P.C.

[57] ABSTRACT

In a rubber contact switch in which ends of lead lines of an LED extend to the rear surface of a printed board through holes of a rubber contact sheet to be soldered on the printed board, a recessed portion is formed in the peripheral portions of the holes on the rear surface of the rubber contact sheet, and heat generated by soldering of the lead lines is prevented from being directly transmitted to the rubber contact sheet.

8 Claims, 3 Drawing Sheets

RUBBER CONTACT SWITCH

BACKGROUND OF THE INVENTION

1. Field of the Invention

The present invention relates to a rubber contact switch used in an automobile or the like and, more particularly, to a rubber contact sheet formed on a printed board.

2. Prior Art

A conventional rubber contact switch is disclosed in Japanese Unexamined Utility Model Publication No. 6-3752. A rubber contact switch shown in FIG. 1 in this publication comprises a rubber contact sheet consisting of a silicone rubber, a pair of pressing members are vertically movably arranged on the rubber contact sheet. The upper end of each pressing member is in contact with a key top. The key top is horizontally oscillated to turn on/off a switch of the printed board. The left pressing member consists of a transparent member such as polycarbonate or acrylic. Light rays from a chip-type LED mounted on the printed board are transmitted to the pressing member through the transparent rubber contact sheet to illuminate the illumination point of the key top.

FIG. 3 in this publication shows an arrangement in which an LED with a lead line is used in place of the chip-type LED, and this LED is arranged between the pressing members. In this rubber contact switch, the lead line of the LED extends to the rear side of the printed board through a hole formed in the rubber contact sheet, and the end portion of the lead line is soldered on the rear surface of the printed board.

In the former rubber contact switch, the chip-type LED is directly mounted on the printed board to keep water resistance and dust resistance. In this arrangement, when brightness control is to be performed, the position of the LED or the shape of the rubber contact sheet must be changed. For this reason, a large change in design must be performed to achieve the brightness control.

In the later rubber contact switch, the LED with a lead line is used, and brightness can be controlled by a height at which the LED is mounted. For this reason, the former drawback can be removed, but the following problem is posed.

More specifically, when the end portion of the lead line is soldered on the rear surface of the printed board, heat is transmitted to the rubber contact sheet, a portion, where the rubber contact sheet is in contact with the lead line, near the soldered portion may be disadvantageously melted, deformed, or deteriorated.

SUMMARY OF THE INVENTION

The present invention has been made in consideration of the above point, and has as its object to a rubber contact switch using an LED with a lead line whose brightness control can be easily performed, and having a rubber contact sheet which is prevented from melted, deformed, and deteriorated when the lead line is soldered.

In order to achieve the above object, the present invention provides a rubber contact switch comprising: a printed board; a rubber contact sheet arranged on the printed board; a key top supported on a shaft to be oscillated; a pressing member, having an upper end being in contact, with the key top, which presses the rubber contact sheet depending on oscillation of the key top to turn on/off the switch; and an LED with a lead line for illuminating the key top, the lead line having an end extending to the rear surface of the printed board through a hole formed in the rubber contact sheet and being soldered on the printed board, characterized in that a recessed portion is formed in a peripheral portion of the hole on the rear surface of the rubber contact sheet.

According to the present invention, the lead-line type LED is used, brightness control can be performed depending on a height at which the LED is mounted, and heat is caused to radiate from the recessed portion when the lead line is soldered on the printed board. For this reason, the rubber contact sheet can be prevented from being melted, deformed, and deteriorated.

In a preferable aspect of the present invention, a projection portion is formed on the peripheral portion of the hole on the upper surface of the rubber contact sheet.

According to this aspect, since the peripheral portion of the hole is constituted by a projection portion, this portion can be prevented from being decreased in thickness by formation of the recessed portion, sufficient strength can be obtained.

According to another preferable aspect of the present invention, the inner peripheral portion of the upper end of the hole is chamfered.

According to this aspect, an inserting operation for the lead line can be easily performed.

According to still another preferable aspect of the present invention, the hole is formed to have an inverted-trapezoidal vertical section in such a manner that the diameter of the hole decreases downward.

According to this aspect, an inserting operation for the lead line can be more easily performed, the lower end portion of the hole can be brought into tight contact with the lead line without any gap, thereby improving water resistance and dust resistance.

The nature, principle and utility of the invention will become more apparent from the following detailed description when read in conjunction with the accompanying drawings.

DESCRIPTION OF THE PREFERRED EMBODIMENTS

Embodiments of the present invention will be described below with reference to the accompanying drawings.

Figure 1:
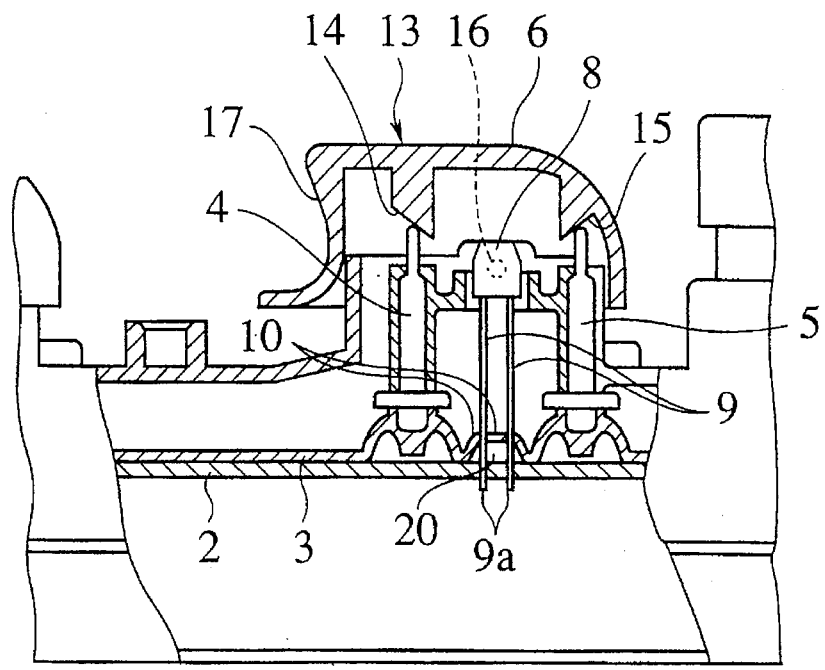
FIG. 1 is a longitudinal sectional view showing the first embodiment of a rubber contact switch according to the present invention.

FIG. 1 shows a rubber contact switch 13 as the first embodiment of the present invention. The rubber contact switch 13 comprises a rubber contact sheet 3 arranged on a printed board 2, and a pair of pressing members 4 and 5 are vertically movably arranged on the rubber contact sheet 3. The upper ends of the pressing members 4 and 5 are in contact with tapered portions 14 and 15 of a key top 6. The key top 6 is supported by a shaft 16 to be oscillated, and is designed to be horizontally oscillated on the shaft 16 serving as a fulcrum by operating a hook portion 17 on the left side in FIG. 1. More specifically, when the hook portion 17 is pressed downward, the key top 6 is oscillated counterclockwise, and the left tapered portion 14 presses the pressing member 4 to move the pressing member 4 downward and to turn on the switch (not shown) of the printed board 2. When the hook portion 17 is pressed upward, the key top 6 is oscillated clockwise, and the right tapered portion 15 moves the pressing member 5 to turn on a switch below the pressing members 4 and 5 in the same manner as described above.

Figure 2:
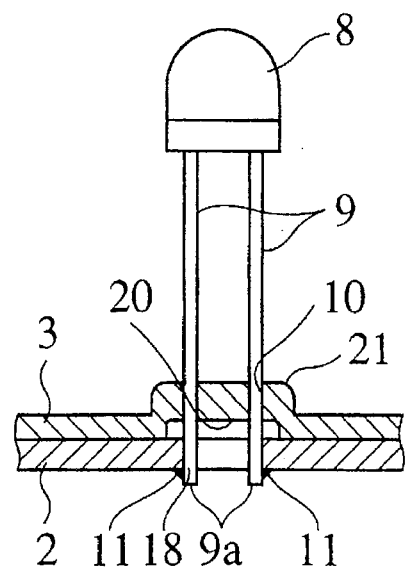
FIG. 2 is a sectional view showing an attachment portion of an LED with a lead line in the rubber contact switch of the present invention.
Figure 3A:
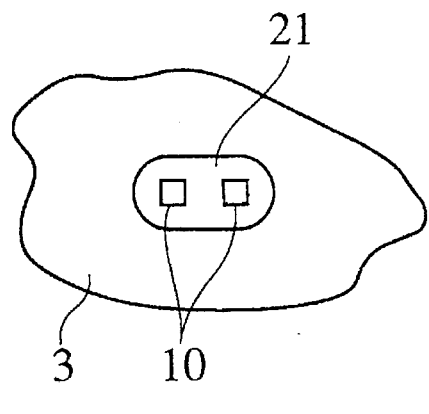
FIGS. 3A to 3B are views showing a main part of a rubber contact sheet of the attachment portion of the LED with the lead line in FIG. 2.
Figure 3B:
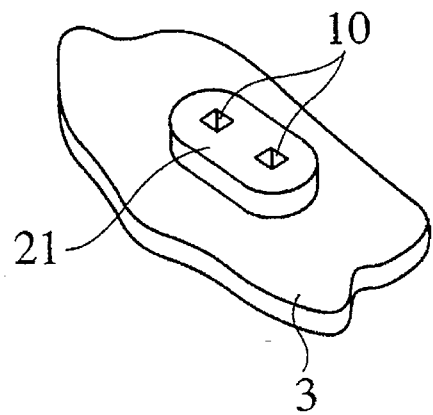

An LED 8 with lead lines 9 is attached between the pressing members 4 and 5. As shown in FIGS. 2, 3A, and 3B, the lead lines 9 extend to the rear surface of the printed board 2 through holes 10 of the rubber contact sheet 3 and holes 18 of the printed board 2, and end portions 9a of the lead lines 9 are soldered on the printed board 2 by automatic soldering, thereby forming soldered portions 11. At this time, each of the holes 10 is formed to have a square hole depending on the sectional shape of the lead line 9.

A recessed portion 20 is formed in the rear surface (surface on the printed board 2 side) of the rubber contact sheet 3 by performing a thinning process to the peripheral portions of the holes 10. A projection portion 21 is formed on the upper surface of the rubber contact sheet 3 by swelling the peripheral portions of the holes 10.

Since the recessed portion 20 is formed, heat generated by soldering is caused to radiate from the recessed portion 20. For this reason, the heat can be prevented from being directly transmitted to the rubber contact sheet 3, and the rubber contact sheet 3 can be prevented from being melted, deformed, and deteriorated. In addition, the projection portion 21 is preferably formed to reinforce the rubber contact sheet. However, when the rubber contact sheet has sufficient strength, the projection portion 21 need not be formed.

Figure 4:
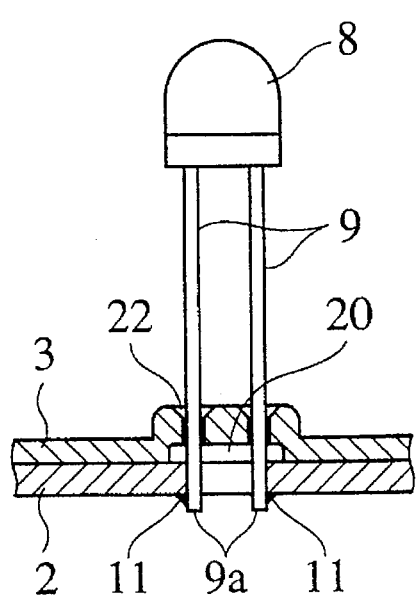
FIG. 4 is a sectional view showing an attachment portion of an LED with a lead line in a rubber contact switch according to the second embodiment of the present invention.
Figure 5:
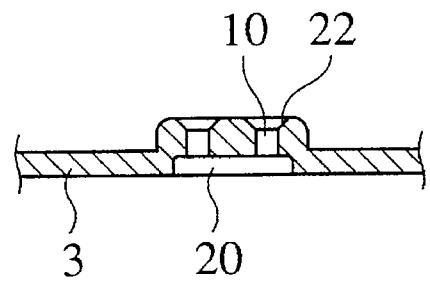
FIG. 5 is a sectional view showing only a rubber contact sheet extracted from the sectional view in FIG. 4.
Figure 6A:
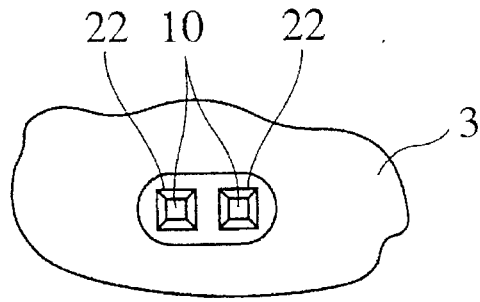
FIGS. 6A and 6b are sectional views a main part of the rubber contact sheet of the attachment portion of the LED with the lead line in FIG. 4.
Figure 6B:
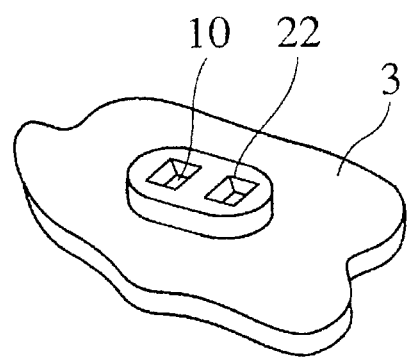

FIGS. 4 to 6 show the second embodiment of the present invention. In this embodiment, chamfered portions 22 are formed the inner peripheral portions of the upper ends of holes 10 in a rubber contact sheet 3. In this arrangement, a lead line 9 can be easily inserted into the hole 10, and workability in mounting of an LED is improved.

Figure 7:
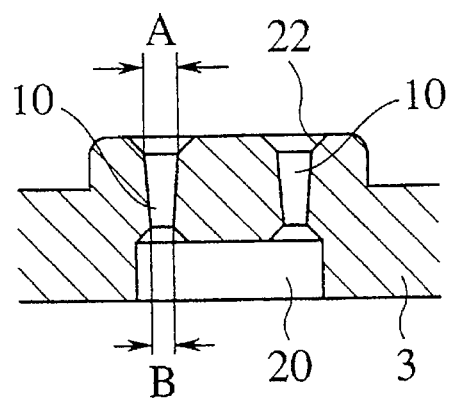
FIG. 7 is a sectional view showing an attachment portion of an LED with a lead line in a rubber contact switch according to the third embodiment of the present invention.

FIG. 7 shows the third embodiment of the present invention. In this embodiment, a hole 10 in a rubber contact sheet 3 is formed to have an inverted-trapezoidal vertical section in such a manner that the diameter of the hole decreases downward. More specifically, when the diameter of the upper end of the hole 10 is set to be A, and the diameter of the lower end is set to be B, A>B is satisfied. A chamfered portion 22 is formed in the inner peripheral portion of the upper end of the hole 10.

With the above arrangement, the lead line 9 can be easily inserted into the hole 10, and the portion having the diameter B is in tight contact with the lead line 9. For this reason, water resistance or dust resistance are improved. When the diameter B of the lower end of the hole 10 is set to be smaller than that of the lead line 9, adhesion between the lead line 9 and the hole 10 improved, and the water resistance and dust resistance are more improved.

As has been described above, according to the embodiments of the present invention, an LED with lead lines is used. For this reason, brightness control can be easily performed by a height at which the LED is mounted, and heat is caused to radiate from the recessed portion when the lead lines are soldered on the printed board. Therefore, the rubber contact sheet can be prevented from melted, deformed, and deteriorated.

Since the peripheral portion of the hole is constituted by a projection portion, the peripheral portion can be prevented from being thinned by forming the recessed portion, and the rubber contact sheet can obtain sufficient strength.

The inner peripheral portion of the upper end of the hole is chamfered, an inserting operation for the lead line can be easily performed.

In addition, since the hole is formed to have an inverted-trapezoidal vertical section in such a manner that the diameter of the hole decreases downward, the inserting operation for the lead line can be more easily performed, the hole is in tight contact with the lead line at the lower end portion of the hole without any gap, and water resistance and dust resistance can be improved.

It should be understood that many modifications and adaptations of the invention will become apparent to those skilled in the art and it is intended to encompass such obvious modifications and changes in the scope of the claims appended hereto.

What is claimed is:

1. A rubber contact switch comprising:

a printed board;

a rubber contact sheet arranged on said printed board;

a key top supported on a shaft to be oscillated;

a pressing member, having an upper end being in contact with said key top, which presses said rubber contact sheet depending on oscillation of said key top to turn on/off said switch; and an LED with a lead line for illuminating said key top, the lead line having an end extending to the rear surface of said printed board through a hole formed in said rubber contact sheet and being soldered on said printed board, characterized in that a recessed portion is formed in a peripheral portion of the hole on the rear surface of said rubber contact sheet.

2. A rubber contact switch according to claim 1, wherein a projection portion is formed on the peripheral portion of the hole on the upper surface of said rubber contact sheet.

3. A rubber contact switch according to claim 2, wherein the hole is formed to have an inverted-trapezoidal vertical section in such a manner that the diameter of the hole decreases downward.

4. A rubber contact switch according to claim 2, wherein the inner peripheral portion of the upper end of the hole is chamfered.

5. A rubber contact switch according to claim 4, wherein the hole is formed to have an inverted-trapezoidal vertical section in such a manner that the diameter of the hole decreases downward.

6. A rubber contact switch according to claim 1, wherein the inner peripheral portion of the upper end of the hole is chamfered.

7. A rubber contact switch according to claim 3, wherein the hole is formed to have an inverted-trapezoidal vertical section in such a manner that the diameter of the hole decreases downward.

8. A rubber contact switch according to claim 1, wherein the hole is formed to have an inverted-trapezoidal vertical section in such a manner that the diameter of the hole decreases downward.

* * * * *